United States Patent
Park

(10) Patent No.: US 8,369,155 B2
(45) Date of Patent: Feb. 5, 2013

(54) OPERATING METHOD IN A NON-VOLATILE MEMORY DEVICE

(75) Inventor: Seong Je Park, Sacheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 119 days.

(21) Appl. No.: 12/953,235

(22) Filed: Nov. 23, 2010

(65) Prior Publication Data

US 2011/0122706 A1    May 26, 2011

Related U.S. Application Data

(63) Continuation-in-part of application No. 11/965,999, filed on Dec. 28, 2007, now Pat. No. 7,839,692.

(51) Int. Cl.
   *G11C 16/04* (2006.01)
(52) U.S. Cl. ............... 365/185.22; 365/185.25
(58) Field of Classification Search ............ 365/185.22, 365/185.25, 185.17, 185.18
   See application file for complete search history.

(56) References Cited

U.S. PATENT DOCUMENTS

| | | | | |
|---|---|---|---|---|
| 5,867,426 A | * | 2/1999 | Ahn et al. ............ | 365/185.18 |
| 6,661,711 B2 | | 12/2003 | Pan et al. | |
| 6,977,849 B2 | * | 12/2005 | Tomishima ............ | 365/189.09 |
| 2003/0147279 A1 | | 8/2003 | Pan et al. | |
| 2005/0024956 A1 | | 2/2005 | Tran et al. | |
| 2006/0221661 A1 | | 10/2006 | Hemink et al. | |
| 2007/0263466 A1 | | 11/2007 | Morishita et al. | |
| 2008/0094871 A1 | | 4/2008 | Parkinson | |
| 2008/0304339 A1 | | 12/2008 | Dietrich et al. | |

FOREIGN PATENT DOCUMENTS

| | | |
|---|---|---|
| JP | 05-081880 | 4/1993 |
| JP | 2000-236031 | 8/2000 |
| JP | 2007-102923 | 4/2007 |
| KR | 100694972 B1 | 3/2007 |
| WO | 2006/105133 | 10/2006 |

* cited by examiner

*Primary Examiner* — Vu Le
(74) *Attorney, Agent, or Firm* — Kilpatrick Townsend & Stockton LLP

(57) ABSTRACT

A method of verifying a non-volatile memory device to increase the read margin even though a negative verifying voltage is not applied is disclosed. The method of verifying a non-volatile memory device includes coupling a cell string to a bit line precharged to a high level through a sensing node, the cell string being provided between a common source line and the bit line; applying a verifying voltage to a plurality of word lines associated with the cell string; disconnecting the bit line from the sensing node; coupling the common source line to the cell string while the verifying voltage is applied to the word lines, wherein the common source line is applied with a bias voltage higher than a ground voltage; and coupling the bit line to the sensing node so as to detect a level of the bit line.

4 Claims, 7 Drawing Sheets

OPERATING METHOD IN A NON-VOLATILE MEMORY DEVICE

CROSS-REFERENCE TO RELATED APPLICATIONS

This application is a continuation-in-part of U.S. patent application Ser. No. 11/965,999 filed on Dec. 28, 2007, which claims priority from Korean Patent Application No. 2007-79487 filed on Aug. 8, 2007, the contents of which are incorporated herein by reference in its entirety.

BACKGROUND OF THE INVENTION

The present invention relates to an operating method in a non-volatile memory device for performing a soft program step so as to improve threshold voltage distribution of an erased cell.

Recently, the demand has increased for non-volatile memory device which electrically programs and erases data, and does not require a refresh function for periodically rewriting data.

The non-volatile memory device generally includes a memory cell array having matrix-typed cells for storing data, and a page buffer for programming data to a specific cell in the memory cell or reading data from a cell.

The page buffer has a pair of bit lines connected to a given memory cell, a register for temporarily storing data to be programmed to the memory cell or data read from a cell, a sensing node for sensing a voltage level of a specific bit line or voltage level of a certain register, and a bit line selecting circuit for controlling connection of the bit line and the sensing node.

When an erase operation is performed in the non-volatile memory device, a soft program operation is performed so as to improve threshold voltage distribution of an erased memory cell (e.g., when a cell is over erased). However, in a conventional soft program operation, though only a threshold voltage of one cell included in one cell string is higher than a verifying voltage, a soft program operation for the whole block is stopped. Accordingly, the threshold voltage distribution of the erased cells may become wide with the use of the soft program operation.

SUMMARY OF THE INVENTION

The present invention relates to a method of verifying an erase operation to increase the read margin even though a negative verifying voltage is not applied.

The present invention also relates to a method of verifying a soft program operation to increase the read margin even though a negative verifying voltage is not applied.

A method of verifying a non-volatile memory device according to one example embodiment of the present invention includes coupling a cell string to a bit line precharged to a high level through a sensing node, the cell string being provided between a common source line and the bit line; applying a verifying voltage to a plurality of word lines associated with the cell string; disconnecting the bit line from the sensing node; coupling the common source line to the cell string while the verifying voltage is applied to the word lines, wherein the common source line is applied with a bias voltage higher than a ground voltage; and coupling the bit line to the sensing node so as to detect a level of the bit line.

A method of verifying a non-volatile memory device according to another example embodiment of the present invention includes precharging a bit line to a high level through a sensing node by applying a first voltage to a bit line select transistor coupled between the bit line and the sensing node; applying a verifying voltage to a plurality of word lines; disconnecting the bit line from the sensing node; and coupling the bit line to the sensing node by applying a second voltage to the bit line select transistor so as to detect a level of the bit line, the second voltage being smaller than the first voltage, wherein a difference between the first voltage and the second voltage in a verifying operation is higher than a difference between a first voltage and a second voltage that are used in a read operation.

A method of verifying a non-volatile memory device according to another example embodiment of the present invention includes coupling a cell string to a bit line precharged to a high level through a sensing node; applying a verifying voltage to a plurality of word lines associated with the cell string; disconnecting the bit line from the sensing node during a evaluation time in a verifying operation; and coupling the bit line to the sensing node so as to detect a level of the bit line, wherein the evaluation time is shorter than an evaluation time in a read operation.

As described above, a soft program method in a non-volatile memory device may improve threshold voltage distribution of an erased cell. Here, a verifying operation when a verifying voltage of 0V is applied has the same efficiency as a verifying operation when negative verifying voltage is applied. As a result, a read margin may be improved.

DESCRIPTION OF SPECIFIC EMBODIMENTS

Hereinafter, the embodiments of the present invention will be explained in more detail with reference to the accompanying drawings.

Figure 1:
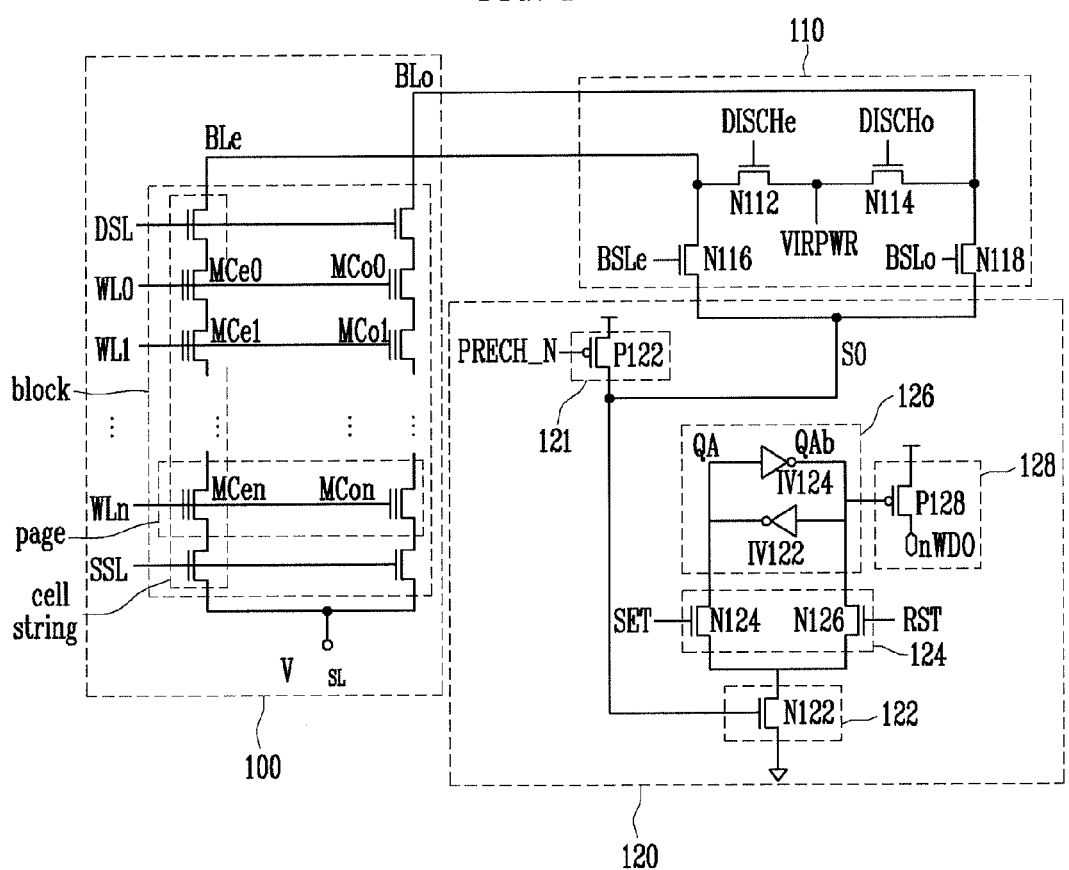
FIG. 1 is a view illustrating a non-volatile memory device according to one embodiment of the present invention.

FIG. 1 is a view illustrating a non-volatile memory device according to one embodiment of the present invention.

The non-volatile memory device includes a memory cell array 100, even bit line BLe and odd bit line BLo coupled to the memory cell array 100, a register circuit 120 for storing specific data, a sensing node SO formed at a node connected to the bit lines BLe and BLo and the register circuit 120, and a bit line selecting circuit 110 for selectively coupling the even bit line BLe or the odd bit line BLo to the sensing node SO. A page buffer is defined by a bit line selecting circuit 110 and the register circuit 120. In another implementation, a different number of bit lines are associated with each page buffer.

The memory cell array 100 has a plurality of cell strings. Each cell string includes a drain select transistor, a source select transistor, and a plurality of memory cells MCe0 to MCen and MCo0 to MCon for storing data connected in series and provided between the drain and source select transistors. As shown in the figure, one of the cell strings is connected to an even bit line BLe, and another is connected to an odd bit line BLo. Although not shown, the memory cell array 100 has many more cell strings therein, where each cell string is connected to a bit line. The bit lines are used to select the corresponding cell strings, so that certain operations may be performed thereto.

A plurality of word lines WL0 to WLn are coupled to the gates of the memory cells, where each word line is configured to select the memory cells in the same page. A drain select line DSL is coupled to the drain select transistors of the cell strings. A source select line SSL is coupled to the source select transistors of the cell strings.

A page is defined by the memory cells connected to the same word line. A block is defined by a plurality of the cell strings. Generally, a block has thousands of cell strings.

The bit line selecting circuit 110 includes an N-MOS transistor (or even bit line select transistor) N116 for coupling the even bit line BLe to the sensing node SO in response to a first bit line selecting signal BSLe and an N-MOS transistor N118 (or odd bit line select transistor) for coupling the odd bit line BLo to the sensing node SO in response to a second bit line selecting signal BSLo.

In addition, the bit line selecting circuit 110 further includes a control signal inputting terminal for transmitting a control signal VIRPWR having a specific level, an N-MOS transistor N112 for coupling the even bit line BLe to the control signal inputting terminal in response to a first discharge signal DISCHe, and an N-MOS transistor N114 for coupling the odd bit line BLo to the control signal inputting terminal in response to a second discharge signal DISCHo.

Each of the bit lines is discharged or precharged to a certain voltage level according to an operation performed on the corresponding cell string. Additionally, the bit line is coupled to the sensing node SO, and so a voltage of the sensing node SO is applied to a corresponding bit line or a voltage of the bit line is provided to the sensing node SO.

The register circuit 120 has a sensing node precharging circuit 121 for precharging the sensing node SO to a high level.

The sensing node precharging circuit 121 includes a P-MOS transistor P122 for coupling the sensing node SO to a terminal corresponding to a power supply voltage in response to a precharge signal PRECH_N. Accordingly, the P-MOS transistor P122 applies the power supply voltage VDD to the sensing node SO in response to the precharge signal PRECH_N having a low level.

The register circuit 120 includes a latch 126 having inverters IV122 and IV124, a sensing node sensing circuit 122 for providing a ground voltage to the latch 126 in response to voltage level of the sensing node SO, a data setting circuit 124 for applying the ground voltage to a first node QA or a second node QAb of the latch 126, and a verifying circuit 128 for outputting a verifying finish signal in accordance with a level of the second node QAb of the latch 126.

In the latch 126, an input terminal of one inverter IV122 or IV124 is coupled to an output terminal of the other inverter, and so specific data are stored in the latch 126.

The first node QA is formed at a node connecting an output terminal of the first inverter IV122 and an input terminal of the second inverter IV124. The second node QAb is formed at a node connecting an input terminal of the first inverter IV122 and an output terminal of the second inverter IV124. Accordingly, in the case that logic high data are transmitted to the first node QA, logic low data are outputted from the second node QAb. Hence, data is stored in the latch 126.

The sensing node sensing circuit 122 has an N-MOS transistor N122 coupled between the data setting circuit 124 and the ground, and applies the ground voltage to the latch 126 through the data setting circuit 124 in accordance with a level of the sensing node SO, wherein a gate of the N-MOS transistor N122 is coupled to the sensing node SO. Hence, in the case that a voltage having a high level is applied to the sensing node SO, the N-MOS transistor N122 is turned on. As a result, the ground voltage is provided to the data setting circuit 124.

The data setting circuit 124 provides the ground voltage to the first node QA in accordance with a first data setting signal SET or a second data setting signal RST. In addition, the data setting circuit 124 provides the ground voltage to the second node QAb in accordance with the first data setting signal SET or the second data setting signal RST.

To perform the above operation, the data setting circuit 124 includes a first N-MOS transistor N124 coupled between the first node QA and the sensing node sensing circuit 122 and turned on in response to the first data setting signal SET, and a second N-MOS transistor N126 coupled between the second node QAb and the sensing node sensing circuit 122 and turned on in response to the second data setting signal RST.

Accordingly, in the case that the sensing node SO has a high level and the first data setting signal SET having a high level is transmitted to the N-MOS transistor N124, the first N-MOS transistor N124 is turned on, and so the ground voltage is applied to the first node QA. As a result, the first node QA has data having a low level, and the second node QAb has data having a high level.

In the case that the sensing node SO has a high level and the second data setting signal RST having a high level is transmitted to the N-MOS transistor N126, the second N-MOS transistor N126 is turned on, and so the ground voltage is applied to the second node QAb. As a result, the second node QAb has data having a low level, and the first node QA has data having a high level.

The verifying circuit 128 has a P-MOS transistor P128 coupled between a terminal corresponding to the power supply voltage and a verifying finish signal outputting terminal nWDO and turned on in response to voltage level of the second node QAb. Hence, in the case that data having a low level are transmitted to the second node QAb, the P-MOS transistor P128 is turned on. As a result, the power supply voltage is applied to the verifying finish signal outputting terminal nWDO.

For example, it is assumed that the second node QAb of each of the page buffers is initialized to data having a high level (or logic '1'). Here, in the case that a program operation is performed about specific cell, data having a low level (or logic '0') are stored in the second node QAb.

The program operation is performed in accordance with data stored in each of the latches. In the case that it is verified that program of a corresponding cell is finished, the sensing node SO has a voltage having a high level. Accordingly, in the case that a high signal is applied to the sensing node sensing circuit 122 and the first data setting signal SET having a high level is transmitted to the N-MOS transistor N124, the data stored in the second node QAb are converted into data having a high level.

In the case that the program operation about a certain cell is finished, data having a high level are stored in the second node QAb. As a result, the verifying finish signal outputting terminal nWDO is outputs the verifying finish signal of a low level.

However, in the case that the program operation is not finished, a voltage having a low level is applied to the sensing node sensing circuit 122. Hence, data (or logic '0') having a low level stored in the second node QAb are maintained as it is, and the verifying finish signal outputting terminal nWDO outputs the power supply voltage.

In brief, in the case that the verifying finish signal outputting terminal nWDO outputs the signal of a low level, it is verified that the program operation is finished.

Hereinafter, the soft program method in the non-volatile memory device will be described in detail.

Figure 2A:
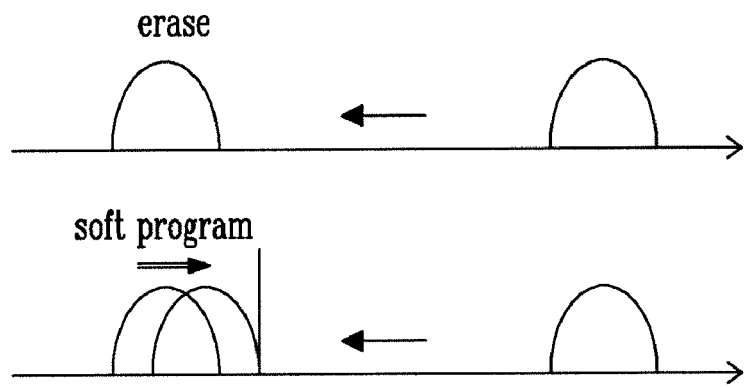
FIG. 2A is a view illustrating a conventional soft program method.

FIG. 2A illustrates a conventional soft program method. An erase operation for cells is performed in blocks, and the soft program operation is performed so as to increase the threshold voltage of erased cells. Subsequently, a verifying operation uses a verifying voltage PV1 to determine if the soft program operation has been completed. Here, if at least one cell included in a cell string of in a block is programmed to a voltage more than the verifying voltage PV1, the soft program operation is stopped.

Figure 2B:
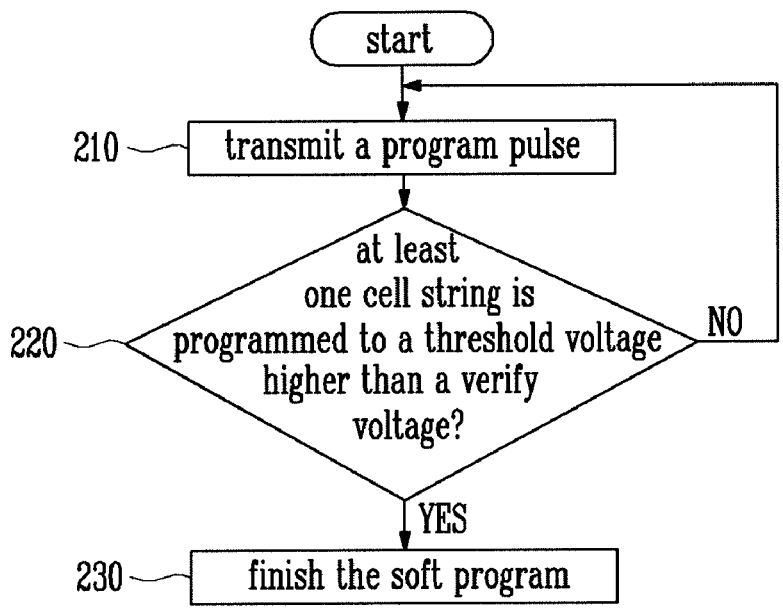
FIG. 2B is a flow chart illustrating the conventional soft program method.

FIG. 2B is a flow chart illustrating a conventional soft program method. A program pulse is transmitted to the cells in a block (step S210).

At step S220, it is determined whether or not any cell (or cell string) is programmed to a threshold voltage more than the verifying voltage. This step will be described in detail with reference to FIG. 1.

A specific bit line is precharged to a high level for the verifying operation, and the verifying voltage PV1 is applied to the word lines WL0 to WLn. Here, in the case that a threshold voltage of a certain cell included in a given cell string is increased to a voltage more than the verifying voltage PV1, the cell is not turned on. As a result, in the cell string, a current path is not formed between the bit line and the common source line. Accordingly, the bit line coupled to the cell string maintains the precharged voltage level, i.e., a voltage of high level.

The voltage of the bit line precharged to a high level is applied to the sensing node SO, and so the N-MOS transistor N122 in the sensing node sensing circuit 122 is turned on. Accordingly, data stored in the second node QAb may be changed in accordance with the first data setting signal SET or the second data setting signal RST.

If a cell string corresponding to the above operation is found, the soft program operation is stopped. Accordingly, when the threshold voltage of a cell in a block is increased to a voltage more than the verifying voltage PV1, the soft program operation is finished.

In step S210, if the threshold voltage distribution of all cell stings in a block is smaller than the verifying voltage PV1, the program pulse is applied.

However, if any cell is programmed to a voltage more than the verifying voltage PV1, the soft program operation is finished (step S230).

Figure 2C:
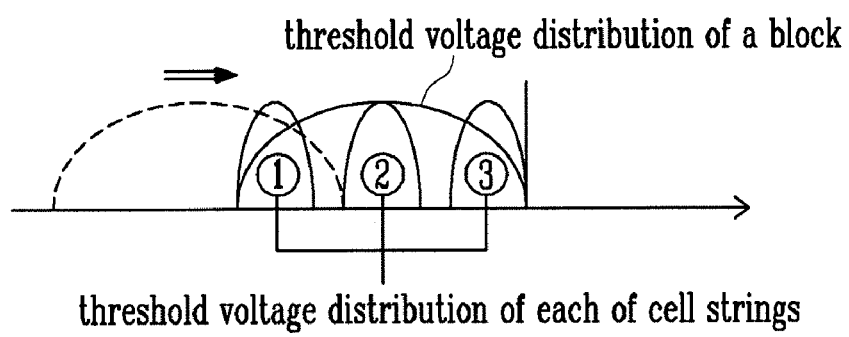
FIG. 2C is a view illustrating threshold voltage distribution after the conventional soft program method is performed.

FIG. 2C illustrates threshold voltage distribution after a conventional soft program method is performed, and problem associated with the soft program operation.

Since the soft program operation is finished when the threshold voltage of any cell (or cell string) is increased to a voltage higher than the verifying voltage PV1, the threshold voltage distribution of the entire block may be wide.

In other words, in the case of cell strings 1, 2 where the increase of the threshold voltage is slow unlike cell stings 3 where the increase of the threshold voltage is rapid, the threshold voltage is smaller than the verifying voltage PV1. As a result, the threshold voltage distribution of the entire block becomes wide.

Figure 3:
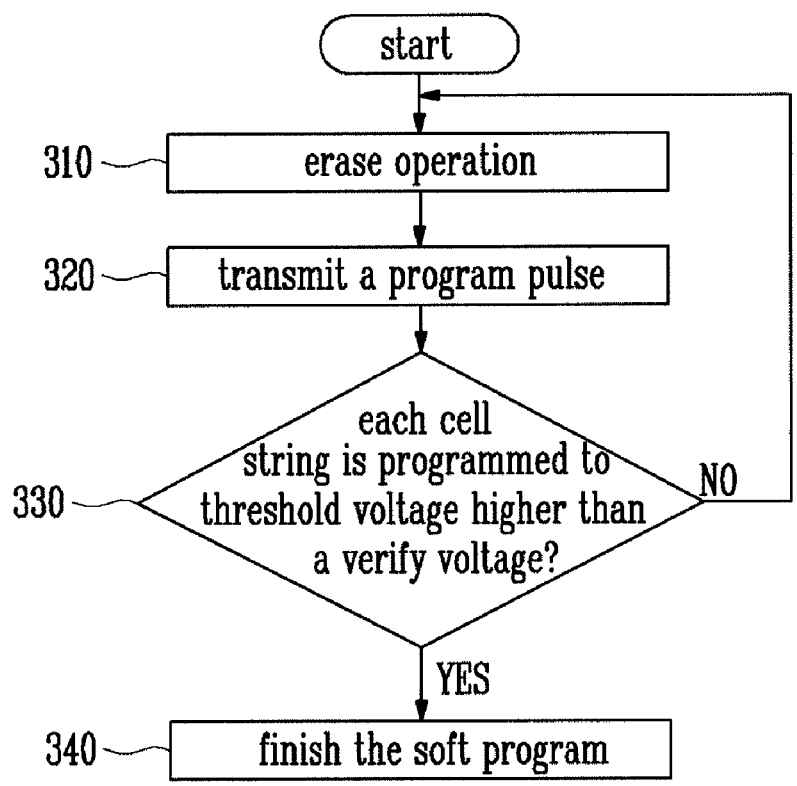
FIG. 3 is a flow chart illustrating a soft program method according to one embodiment of the present invention.

FIG. 3 is a flow chart illustrating a soft program method according to one example embodiment of the present invention.

At step S310, an erase operation is performed on a block basis. That is, a voltage of 0V is applied to the control gates of the cells in a block.

In addition, a voltage of 20V is applied to each of P-well (not shown) and N substrate (not shown) wherein the block is defined. A source and a drain of the transistors coupled to the select lines DSL and SSL are in a floating state by adjusting a gate voltage of the transistors. As a result, a voltage difference of 20V is generated between the control gates and the P-well, and electrons are moved from the floating gates to the P-well by FN-tunneling. In other words, the erase operation is performed.

At step S320, a soft program operation is performed to increase the threshold voltage of erased memory cells by a given level and obtain a tighter threshold voltage distribution. In this case, the second node QAb of the latch 126 included in the register circuit 120 of the page buffer is initialized to data having a low level (i.e., the program operation is started).

Additionally, a voltage having a high level is provided to each of the word lines, and a voltage having a high level is applied to the select transistors corresponding to the select lines DSL and SSL.

The soft program uses an ISPP (Incremental step pulse program) program method. Here, an initial voltage in the soft program is smaller than an initial voltage in the conventional program operation by about 3V to about 4V. In other words, the initial voltage starts at about 9V to about 10V. The voltage is increased by an increment of 0.2V or 0.3V each time.

At step S330, it is verified whether or not the soft program for each cell string has been completed. That is, the program operation is repeated until each of the cell strings in the block has at least one cell that is programmed to have a threshold voltage that is higher than the verifying voltage PV1. This will be described in detail with reference to accompanying drawings.

Figure 5:
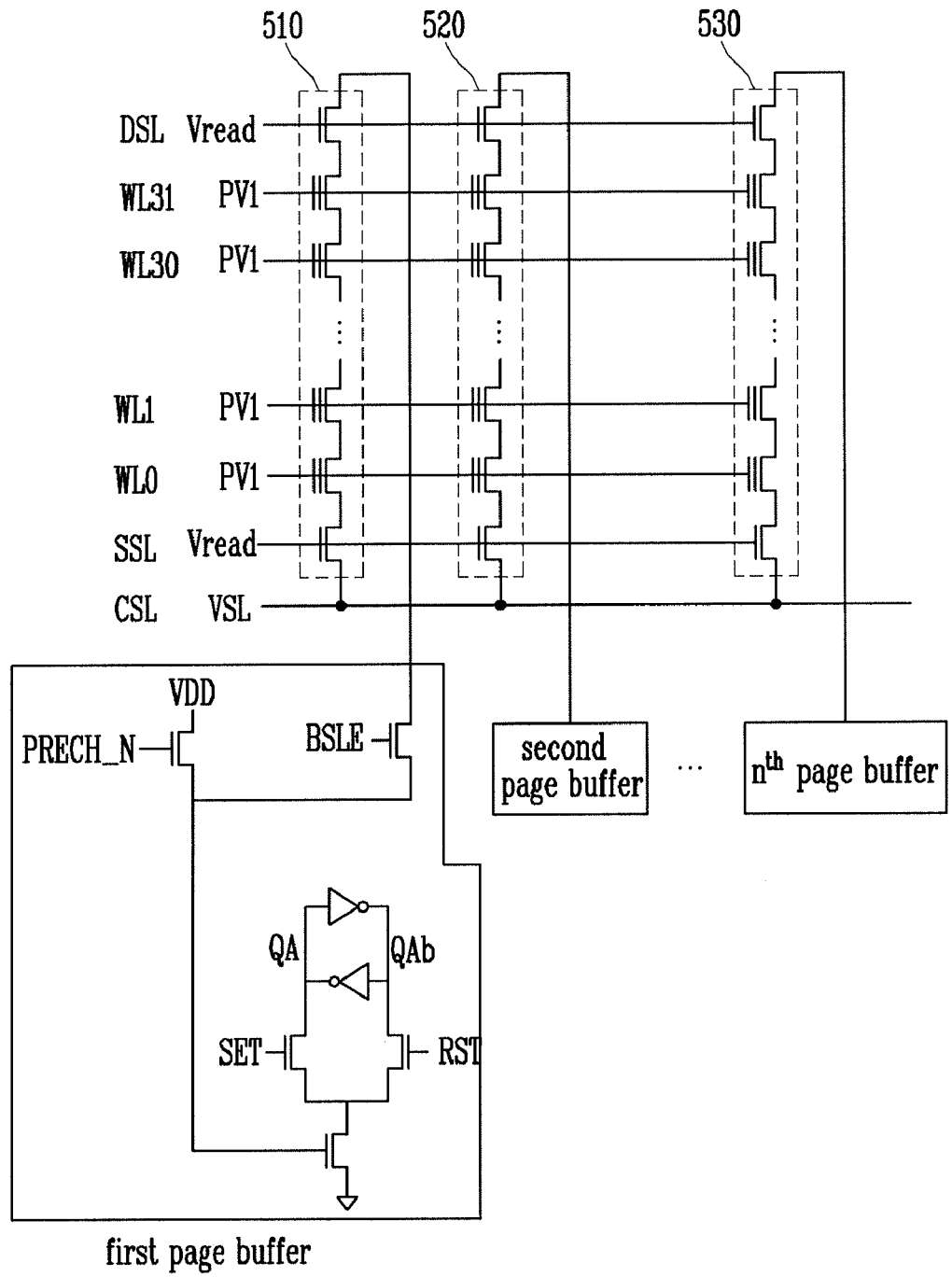
FIG. 5 is a view illustrating the verifying operation according to one embodiment of the present invention.

FIG. 5 is a view illustrating the verifying operation according to one embodiment of the present invention.

The program operation is verified by applying the verifying voltage PV1 to each of the word lines. It is desirable that a voltage of 0V is applied as the verifying voltage PV1. Here, if a certain cell in a first cell string 510 is programmed to have a threshold voltage that is higher than the verifying voltage, the cell will not turn on. As a result, the first cell string 510 does not provide a current path to the common source line, and so the sensing node SO maintains a voltage having a high level.

Accordingly, the ground voltage may be applied to a latch through the sensing node sensing circuit 122 described in FIG. 1. Here, in the case that the first data setting signal SET is provided with a high level, data having a high level are stored in the second node QAb of the latch. In other words, data having a high level are provided to the second node QAb initialized to data having a low level in the program operation. In this case, data having a high level are transmitted to the verifying circuit 128 in FIG. 1, and so the verifying finish signal outputting terminal nWDO is outputs a signal having a low level.

On the other hand, if none of the cells in a second cell string 520 is programmed to have a threshold voltage that is higher than the verifying voltage, every cell in the second cell string 520 is turned on. As a result, the second cell string 520 provides a current path to the common source line, and so a voltage having a low level is applied to the sensing node. Accordingly, the sensing node sensing circuit does not operate, and an initial value (i.e., data having a low level) stored in the second node QAb of the latch is maintained. In this case, data having a low level are transmitted to the verifying circuit 128 in FIG. 1, and so the verifying finish signal outputting terminal nWDO outputs a signal having a high level.

The program operation is repeatedly performed until all cell strings in the block have at least one cell programmed to a threshold voltage that is higher than the verifying voltage. In other words, the program operation is repeatedly performed until the verifying circuits of all page buffers output a signal having a low level.

In step S320, if it is determined that the threshold voltage distribution of the cell string is less than the verifying voltage, the program pulse is applied.

However, if it is determined that the threshold voltage distribution of all cell strings is more than the verifying voltage, the soft program operation ends (step S340). That is, if all cell strings have at least one cell programmed to have a threshold voltage that is higher than the verifying voltage, the soft program operation is finished.

Figure 4:
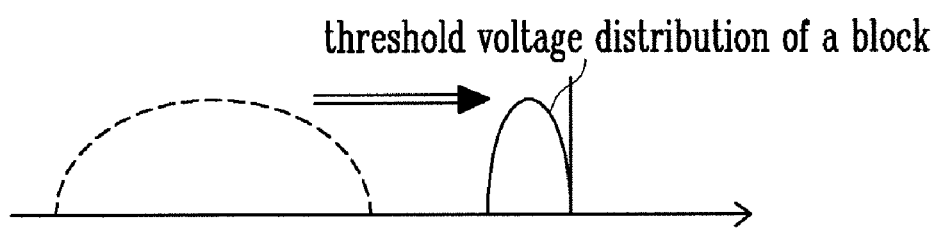
FIG. 4 is a view illustrating a threshold voltage distribution when the soft program operation is finished according to one embodiment of the present invention.

FIG. 4 is a view illustrating a threshold voltage distribution when the soft program operation is finished according to one embodiment of the present invention.

As shown in FIG. 4, the width of the threshold voltage distribution is reduced compared to FIG. 2C. This is because the present invention determines whether or not the threshold voltage of each of the cell strings is programmed to a voltage more than the verifying voltage.

On the other hand, a problem may exist with a reduced read margin if a voltage of 0V as the verifying voltage PV1 is applied.

Figure 6A:
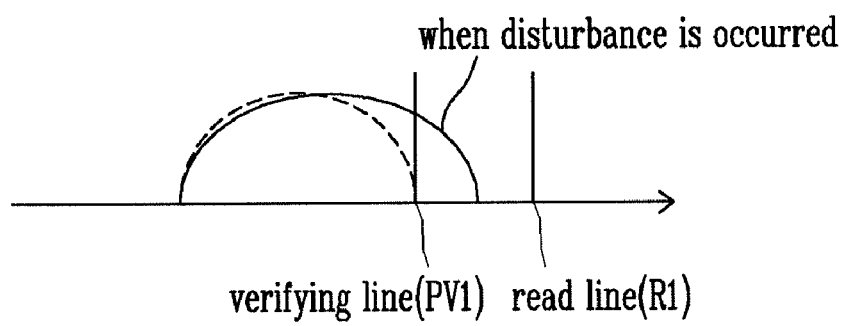
FIG. 6A and FIG. 6B are views illustrating an occurrence of a fail from a read disturbance and small read margin.
Figure 6B:
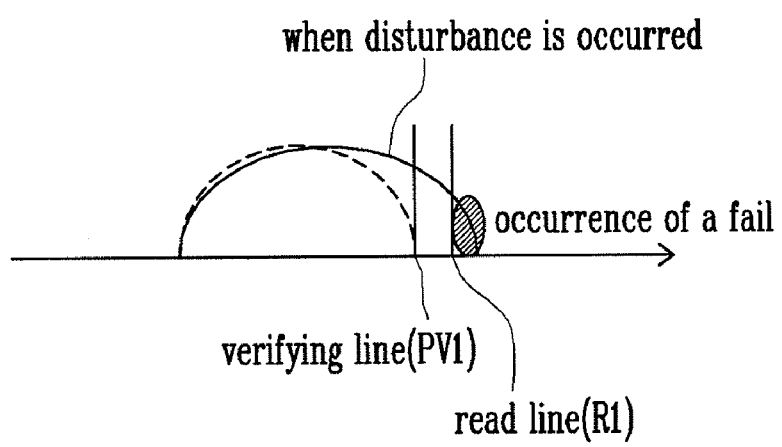

FIG. 6A and FIG. 6B are views illustrating an occurrence of a fail from a read disturbance and a small read margin.

When an adequate read margin exists as shown in FIG. 6A, a fail can be avoided even though a disturbance has occurred.

However, in the case that adequate read margin does not exist as shown in FIG. 6B, a fail may occur. As a result, an erased cell may be read as a programmed cell.

Accordingly, the present embodiment moves a verifying line in a negative direction when an erase operation or a soft program operation are performed, thereby widening a read margin.

Figure 7:
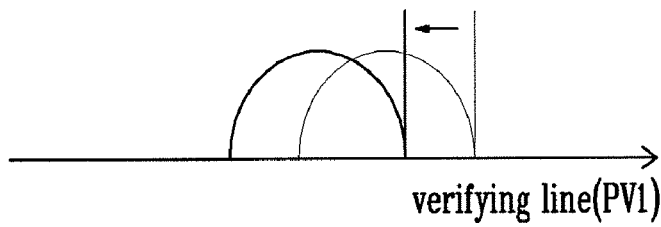
FIG. 7 is a view illustrating a process of moving a verifying line in a negative direction according to one embodiment of the present invention.

FIG. 7 is a view illustrating a process of moving a verifying line in a negative direction according to one embodiment of the present invention.

If the verifying line is moved in the negative direction as shown in FIG. 7, the read margin may be increased.

To increase the read margin, a negative verifying voltage may be applied to each of the word lines. However, it is difficult to apply the negative verifying voltage to each of the word lines in view of embodiment of a circuit. Generally, the voltage generator of NAND flash doesn't have minus voltage generator. So it is difficult or impossible to apply the negative voltage to the word line. Accordingly, the present embodiment provides a method of generating the same effect as in applying a negative verifying voltage.

The method of the present embodiment reduces a sensing current passing to the cell string in an interval of sensing an erase or a program of a specific cell.

Figure 8:
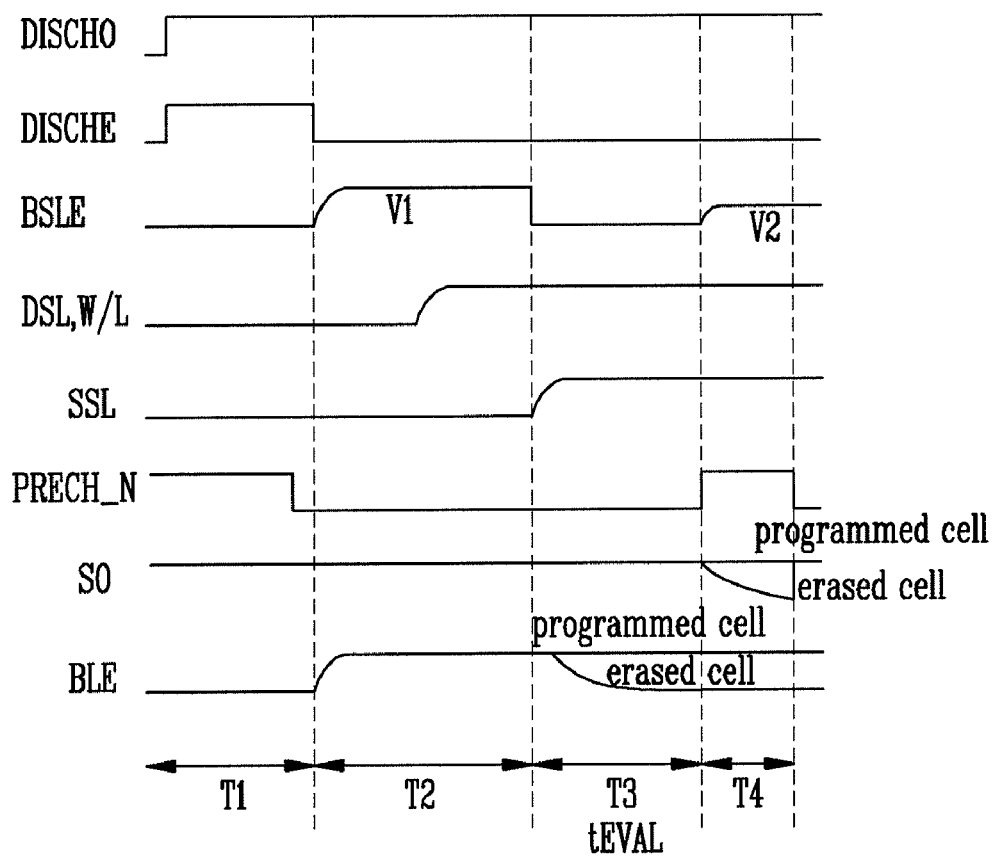
FIG. 8 is a timing diagram illustrating waveform of each of voltage signals applied when a verifying operation is performed according to one embodiment of the present invention.

FIG. 8 is a timing diagram illustrating a waveform of each voltage signal applied when a verifying operation is performed according to one embodiment of the present invention.

Hereinafter, the method will be described in detail with reference to FIG. 1 and FIG. 8 compared to a read operation.

First, a read operation is described with reference to FIG. 1 and FIG. 8.

(1) T1 Interval

A specific bit line is discharged before the bit line is coupled to a cell string having a specific cell to be read.

The even discharge signal DISCHe is enabled during a given time, and so the N-MOS transistor N112 is turned on. Here, since the bias voltage VIRPWR has a low level, the even bit line BLe is discharged to a voltage having a low level.

In addition, the odd discharge signal DISCHo is enabled, and so the N-MOS transistor N114 is turned on. As a result, the odd bit line BLe is discharged to a voltage having a low level.

(2) T2 Interval

The bit line to be coupled to the cell string having the specific cell to be read is precharged to a high level. In particular, the N-MOS transistor N112 is turned off by not activating the even discharge signal DISCHe. Here, in the case that a cell string to be coupled to the odd bit line BLo is first verified, the N-MOS transistor N114 is turned off by not activating the odd discharge signal DISCHo before the N-MOS transistor N112 is turned off.

Subsequently, the transistor P122 is turned on during a certain time by applying the precharge signal PRECH_N having a low level, and so the sensing node SO is precharged to a high level.

Then, the bit line selecting signal BSLe or BSLo having a first voltage level V1 is transmitted to a corresponding transistor (or bit line select transistor) N116 or N118, thereby coupling the bit line BLe or BLo to the sensing node SO. As a result, voltage level of the bit line BLe or BLo is increased to a high level in accordance with the voltage level of the sensing node SO.

Subsequently, a cell string having a cell to be read is coupled to a corresponding bit line by applying a voltage having a high level to the transistor corresponding to the drain select line DSL. Additionally, a read voltage is applied to a selected word line (i.e. a word line to which the cell to be read is connected) and a pass voltage is applied to unselected word lines (i.e. word lines except the selected word line).

(3) T3 Interval

A voltage having a high level is applied to the transistor corresponding to the source select line SSL, and so a cell string having a certain cell of the memory cell array 100 is coupled to the common source line. As a result, a current path is formed between a corresponding bit line and the common source line. A bias voltage VSL applied to the common source line is the ground voltage.

Subsequently, a level of the bit line selecting signal BSLe or BSLo is changed from a high level to a low level, and so a corresponding bit line is disconnected from the sensing node SO during a evaluation time. As a result, the voltage level of the bit line coupled to a corresponding cell is changed during the evaluation time. That is, in the case that the cell is programmed, no current is passed through the current path because the threshold voltage of the cell is increased. Hence, the voltage level of the bit line is maintained. However, in the case that the cell is not programmed (i.e., is an erased cell), current is passed through the current path. Accordingly, the voltage level of the bit line is pulled-down to a low level.

(4) T4 Interval

The precharge signal PRECH_N is converted from a low level to a high level, and so the sensing node SO is disconnected from the terminal corresponding to the power supply voltage.

Then, the bit line selecting signal BSLe or BSLo having a low level is converted into a second voltage level V2, and so a corresponding bit line is coupled to the sensing node SO during a given time.

The voltage level of the sensing node SO is determined in accordance with the voltage level of the bit line. In addition, since the bit line maintains a high level when the corresponding cell is programmed, the N-MOS transistor N122 of the sensing node sensing circuit 122 in FIG. 1 is turned on. Here, since the data setting signal SET having a high level is transmitted to the N-MOS transistor N124 of the data setting circuit 124, data having a high level are stored in the second node QAb when the cell is programmed. Here, a register for storing data related to the program operation may be varied in accordance with a user.

Second, the method according to one embodiment of the present invention is described.

(1) T1 Interval

A specific bit line is discharged before the bit line is coupled to a cell string having a specific cell to be verified.

The even discharge signal DISCHe is enabled during a given time, and so the N-MOS transistor N112 is turned on. Here, since the bias voltage VIRPWR has a low level, the even bit line BLe is discharged to a voltage having a low level.

In addition, the odd discharge signal DISCHo is enabled, and so the N-MOS transistor N114 is turned on. As a result, the odd bit line BLe is discharged to a voltage having a low level.

(2) T2 Interval

The bit line to be coupled to the cell string having the specific cell to be verified is precharged to a high level. In particular, the N-MOS transistor N112 is turned off by not activating the even discharge signal DISCHe. Here, in the case that a cell string to be coupled to the odd bit line BLo is first verified, the N-MOS transistor N114 is turned off by not activating the odd discharge signal DISCHo before the N-MOS transistor N112 is turned off.

Subsequently, the transistor P122 is turned on during a certain time by applying the precharge signal PRECH_N having a low level, and so the sensing node SO is precharged to a high level.

Then, the bit line selecting signal BSLe or BSLo having a first voltage level V1 is transmitted to a corresponding transistor (or bit line select transistor) N116 or N118, thereby coupling the bit line BLe or BLo to the sensing node SO. As a result, voltage level of the bit line BLe or BLo is increased to a high level in accordance with the voltage level of the sensing node SO.

Subsequently, a cell string having a cell to be read is coupled to a corresponding bit line by applying a voltage having a high level to the transistor corresponding to the drain select line DSL. Additionally, a verifying voltage PV1 of 0V is applied to all word lines.

(3) T3 Interval

A voltage having a high level is applied to the transistor corresponding to the source select line SSL, and so a cell string having a certain cell of the memory cell array 100 is coupled to the common source line. As a result, a current path is formed between a corresponding bit line and the common source line. In one embodiment of the present invention, a bias voltage VSL applied to the common source line is higher than the ground voltage by a given level. It is desirable that the bias voltage VSL is about 0.1V to about 0.5V. In one implementation, the bias voltage VSL is about 0.3 V to about 0.5 V. In one implementation, the bias voltage VSL is about 0.2V to about 5V.

In a conventional method, the ground voltage as the bias voltage VSL is applied to the common source line. However, the method of the present embodiment provides the bias voltage VSL higher than the ground voltage by the given level, and so a voltage difference between the bit line precharged to a high level and the common source line is reduced. As a result, the sensing current is reduced.

Subsequently, a level of the bit line selecting signal BSLe or BSLo is changed from a high level to a low level, and so a corresponding bit line is disconnected from the sensing node SO during an evaluation time. As a result, the voltage level of the bit line coupled to a corresponding cell is changed during the evaluation time. That is, in the case that the cell is programmed, no current is passed through the current path because the threshold voltage of the cell is increased. Hence, the voltage level of the bit line is maintained. However, in the case that the cell is not programmed (i.e., is an erased cell), current is passed through the current path. Accordingly, the voltage level of the bit line is pulled-down to a low level. In this case, the present method reduces the evaluation time tEVAL (i.e., T3 interval) compared to a read operation. For example, the evaluation time tEVAL is about 2 μsec to about 7 μsec.

Since the evaluation time tEVAL is reduced as mentioned above, the sensing current may be decreased.

(4) T4 Interval

The precharge signal PRECH_N is converted from a low level to a high level, and so the sensing node SO is disconnected from the terminal corresponding to the power supply voltage.

Then, the bit line selecting signal BSLe or BSLo having a low level is converted into a second voltage level V2, and so a corresponding bit line is coupled to the sensing node SO during a given time.

On the other hand, a difference between the voltages V1 and V2 in the verifying operation is higher than that in the read operation. For example, the difference between the voltages V1 and V2 corresponds to about 0.4V to about 0.9V. In one implementation, the difference is approximately 0.7V. In another implementation, the difference is more than about 0.5V but less than about 1 V.

As a result, the sensing current is reduced. To attain the difference between the voltages V1 and V2, the first voltage V1 has a magnitude higher than that in the read operation or the second voltage V2 has magnitude smaller than that in the read operation.

The voltage level of the sensing node SO is determined in accordance with the voltage level of the bit line. In addition, since the bit line maintains a high level when the corresponding cell is programmed, the N-MOS transistor N122 of the sensing node sensing circuit 122 in FIG. 1 is turned on. Here, since the data setting signal SET having a high level is transmitted to the N-MOS transistor N124 of the data setting circuit 124, data having a high level are stored in the second node QAb when the cell is programmed. Here, a register for storing data related to the program operation may be varied in accordance with a user.

In short, the specific cell is read through the above method to determine whether it has been programmed. This method of reducing the sensing current passing to the cell string in the above verifying operation has the following characteristics.

First, a bias voltage VSL higher than the ground voltage is applied to the common source line.

Second, the difference between the voltages V1 and V2 applied to the bit line selecting signal BSLe or BSLo is higher than that in the read operation.

Third, the evaluation time tEVAL is smaller than that in the read operation.

Figure 9:
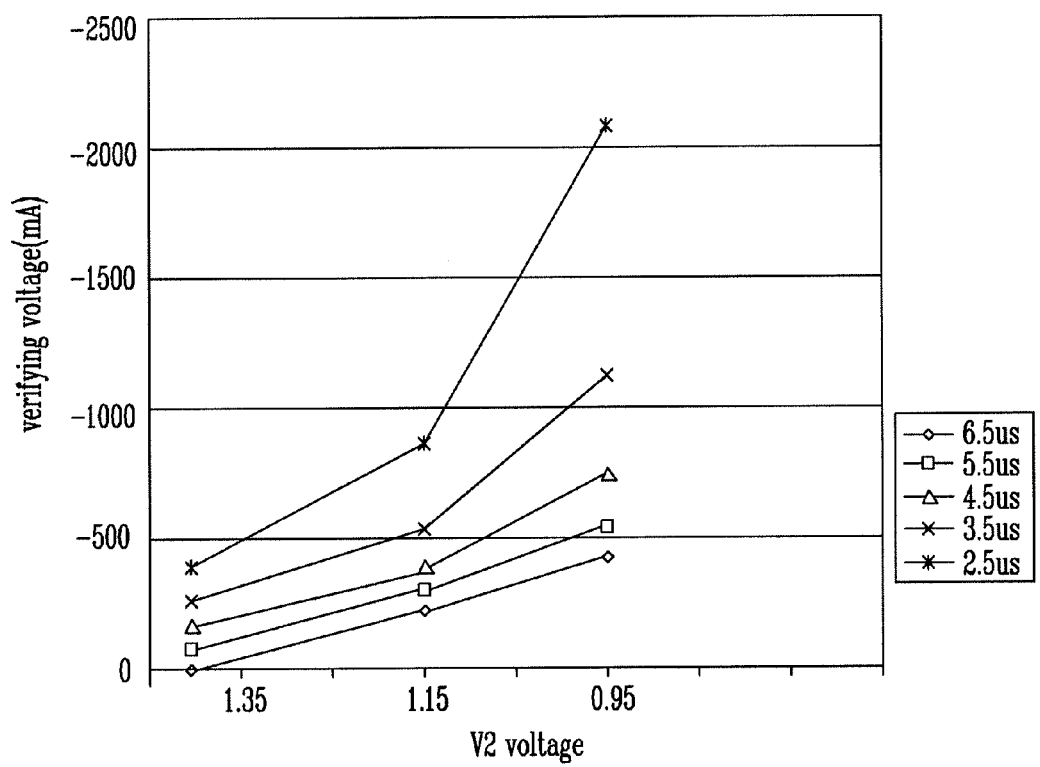
FIG. 9 is a view illustrating change of the verifying voltage according to one embodiment of the present invention.

FIG. 9 is a view illustrating change of the verifying voltage according to one embodiment of the present invention.

FIG. 9 shows the change of the verifying voltage based on the difference between the voltages V1 and V2 and a time of the evaluation interval tEVAL under the condition that the bias voltage VSL applied to the common source line has a constant level.

The difference between the voltages V1 and V2 is increased accordingly as the second voltage V2 of an X axis is reduced. As a result, the verifying voltage is moved in a negative direction.

In addition, the evaluation interval tEVAL may be reduced, and so the verifying voltage is moved in the negative direction.

The verifying method explained above may be applied when an erase verifying operation is performed after an erase operation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of verifying a non-volatile memory device, the method comprising:
    coupling a cell string to a bit line precharged to a high level through a sensing node, the cell string being provided between a common source line and the bit line;
    applying a verifying voltage to a plurality of word lines associated with the cell string;
    disconnecting the bit line from the sensing node;
    coupling the common source line to the cell string while the verifying voltage is applied to the word lines, wherein the common source line is applied with a bias voltage higher than a ground voltage; and
    coupling the bit line to the sensing node so as to detect a level of the bit line.

2. The method of claim 1, wherein the bias voltage applied to the common source line is about 0.1V to about 0.5V.

3. The method of claim 1, wherein the bias voltage applied to the common source line is about 0.2V to about 0.5V.

4. The method of claim 1, wherein the bias voltage applied to the common source line is about 0.3V to about 0.5V.

* * * * *